United States Patent
Kobrinsky et al.

(10) Patent No.: US 7,307,005 B2
(45) Date of Patent: Dec. 11, 2007

(54) WAFER BONDING WITH HIGHLY COMPLIANT PLATE HAVING FILLER MATERIAL ENCLOSED HOLLOW CORE

(75) Inventors: Mauro J. Kobrinsky, Portland, OR (US); Shriram Ramanathan, Hillsboro, OR (US); Scott (Richard) List, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/883,614

(22) Filed: Jun. 30, 2004

(65) Prior Publication Data

US 2006/0003547 A1    Jan. 5, 2006

(51) Int. Cl.
H01L 21/30 (2006.01)

(52) U.S. Cl. ............ 438/456; 438/455; 438/457; 438/458; 438/459; 257/E21.48; 257/E21.519; 257/E21.657

(58) Field of Classification Search ......... 438/455–460
See application file for complete search history.

(56) References Cited

U.S. PATENT DOCUMENTS

| | | | | |
|---|---|---|---|---|
| 3,244,627 A | * | 4/1966 | Smith et al. ............ | 508/249 |
| 3,720,986 A | * | 3/1973 | Cranston ............ | 29/25.42 |
| 6,821,819 B1 | * | 11/2004 | Benavides et al. ........ | 438/122 |
| 6,841,883 B1 | * | 1/2005 | Farnworth et al. ........ | 257/777 |
| 6,872,902 B2 | * | 3/2005 | Cohn et al. ............ | 200/181 |
| 2002/0157611 A1 | * | 10/2002 | Bondestam et al. ...... | 118/725 |
| 2003/0148596 A1 | * | 8/2003 | Kellar et al. ............ | 438/612 |
| 2004/0232537 A1 | * | 11/2004 | Kobrinsky et al. ........ | 257/686 |

OTHER PUBLICATIONS (http://microlab.eecs.berkeley.edu/labmanual/chap9/9.2.html, N. Chen, REV. Mar. 2, 2003).*

* cited by examiner

Primary Examiner—Fernando L. Toledo
Assistant Examiner—Jarrett J Stark
(74) Attorney, Agent, or Firm—George Chen

(57) ABSTRACT

The present invention discloses a method that includes: providing two wafers; forming raised contacts on the two wafers; aligning the two wafers; bringing together the raised contacts; locally deflecting the two wafers; and bonding the raised contacts.

The present invention also discloses a bonded-wafer structure that includes: a first wafer, the first wafer being locally deflected, the first wafer including a first raised contact; and a second wafer, the second wafer being locally deflected, the second wafer including a second raised contact, wherein the second raised contact is bonded to the first raised contact.

6 Claims, 6 Drawing Sheets

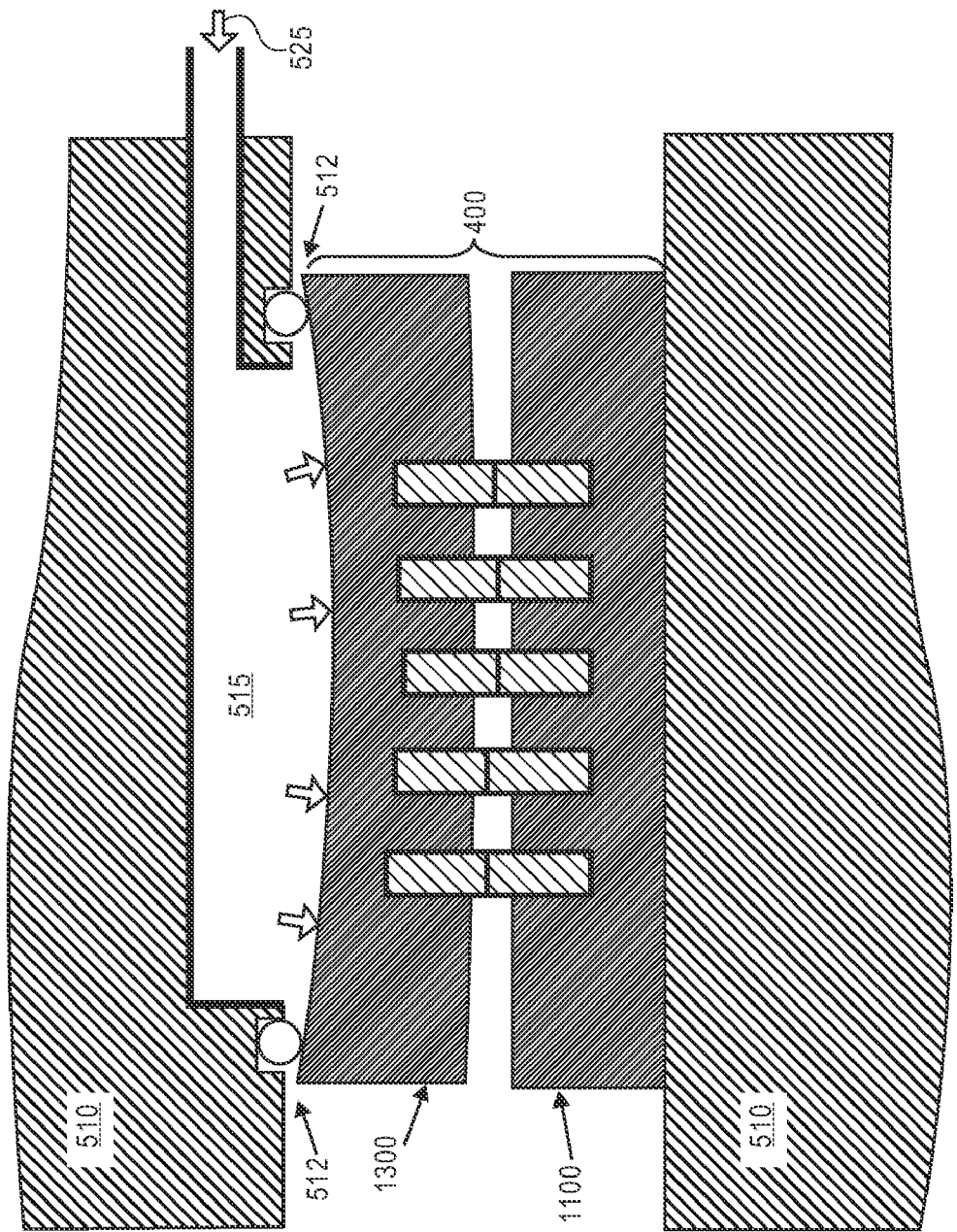

WAFER BONDING WITH HIGHLY COMPLIANT PLATE HAVING FILLER MATERIAL ENCLOSED HOLLOW CORE

BACKGROUND OF THE INVENTION

1. Field of the Invention

The present invention relates to the field of semiconductor integrated circuit (IC) manufacturing, and more specifically, to a method of bonding wafers using highly compliant plates, as well as, a bonded-wafer structure having copper contacts with variable heights.

2. Discussion of Related Art

In 1965, Gordon Moore first observed that the maximum number of devices per area on a chip was doubling every 18 months. Over the four decades since Moore's Law was first stated, the semiconductor industry has successfully introduced new processes and designs to maintain such a rate of increasing device density. In particular, continual enhancements in photolithography have reduced the minimum critical dimension (CD) that may be successfully patterned for a feature on the devices on the chip. Furthermore, major developments in doping, deposition, and etch have allowed a greater precision in controlling concentration, depth, and thickness across the chip.

As the smallest CD that may be achieved for the feature has been inexorably decreased, the fundamental limitations of physics will inevitably slow down the speed and increase the power consumption of the devices on the chip. Important goals include shortening signal path length and reducing resistance-capacitance (RC) delay.

Previously, scaling has predominantly involved a shrinking of the local interconnection within the chip. In the future, it will become even more critical to shrink the global interconnection between chips. An approach being taken is to bond wafers together, such as face-to-face. However, the copper contacts on the wafers may have variable heights. In one case, taller contacts may bond while shorter contacts may remain separated by voids. In another case, shorter contacts may bond, but taller contacts may be damaged.

Thus, what is needed is a method of bonding wafers such that the copper contacts will bond despite variable heights.

BRIEF DESCRIPTION OF THE DRAWINGS

FIGS. 3A-C are illustrations of a cross-sectional view of various embodiments of a highly-compliant plate for bonding wafers having raised contacts with variable heights according to the present invention.

DETAILED DESCRIPTION OF THE PRESENT INVENTION

Figure 1A:
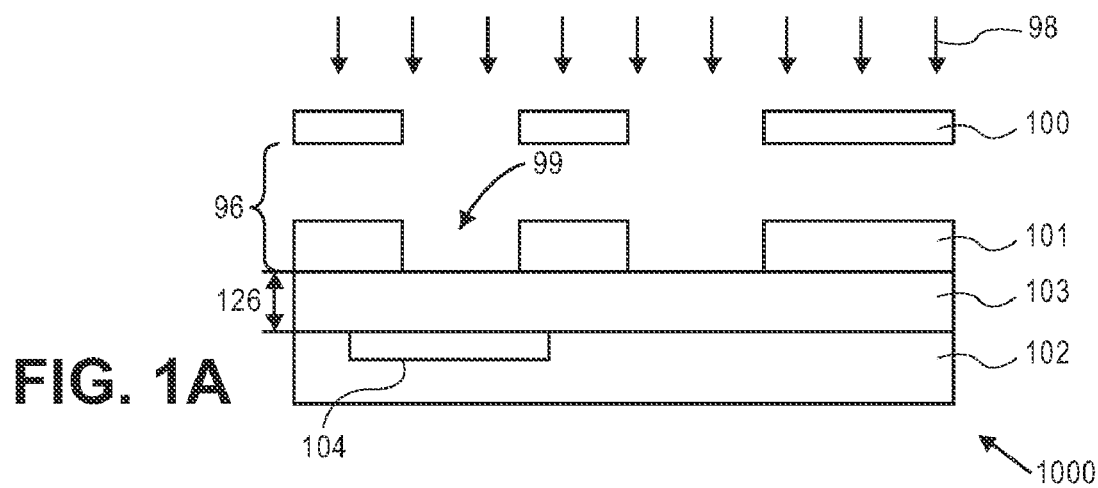
FIGS. 1A-G are illustrations of a cross-sectional view of an embodiment of a method of forming raised contacts on a wafer to be bonded according to the present invention.
Figure 1B:
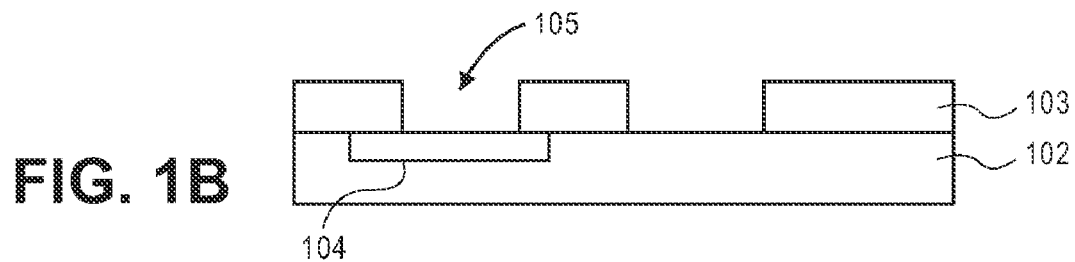

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Various embodiments of a method of bonding wafers using highly compliant plates will be described first, followed by various embodiments of a bonded-wafer structure having copper contacts with variable heights. In an embodiment of the present invention, the wafers being bonded may be similar with respect to materials, structures, dimensions, or functions. In another embodiment of the present invention, the wafers being bonded may be dissimilar in one or more respects.

The wafers may have an initial thickness selected from a range of about 450-900 microns (um). In an embodiment of the present invention, one or more of the wafers may be thinned prior to bonding. In another embodiment of the present invention, one or more of the wafers may be thinned subsequent to bonding.

The thickness after thinning may depend on the size of the wafer and whether another material is used as a supporting medium. In an embodiment of the present invention, the wafer may have a thickness of about 45-135 um after thinning. In another embodiment of the present invention, the wafer may have a thickness of about 15-45 um after thinning. In still another embodiment of the present invention, the wafer may have a thickness of about 5-15 um after thinning.

Some embodiments of a method of bonding wafers using highly compliant plates according to the present invention are shown in FIGS. 1A-K. The substrate 102 may include a bond pad 104, as shown in an embodiment of the present invention in FIG. 1A. The bond pad 104 may include input/output (I/O) of power, ground, or signal for a device (not shown) in the wafer 1000.

The device (not shown) may be formed by adding, removing, or modifying various materials in and on the wafer 1000 by using processes such as oxidation, deposition, ion implantation, thermal processing, electroplating, patterning, and etching. The various materials may be semi-conducting, (such as silicon), electrically insulating (such as oxide or nitride), or electrically conducting (such as doped polysilicon or metal).

The bond pad 104 in the substrate 102 may be formed from electrically conducting material having a thickness selected from a range of about 0.25-1.25 um. The electrically conducting material may include a metal, such as copper, or an alloy.

The substrate 102 may be covered with an insulator 103 formed from electrically insulating material having an initial thickness 126 selected from a range of about 0.5-2.5 um. The electrically insulating material may include an undoped silicon oxide, having a dielectric constant, k, with a value such as 3.9-4.2. The insulator 103 may serve as an interlayer dielectric (ILD) to separate the bond pad 104 from electrically conducting material in an underlying layer (not shown) or an overlying layer (not shown).

Capacitance of a stack 106 of materials in and on the substrate 102 may be reduced by using a low-k material to form all or part of the insulator 103 between the electrically conducting materials. Low-k refers to a value of k that is lower than the value of k of undoped silicon oxide. A fluorinated silicate glass (FSG or SiOF), having k with a value such as 3.4-3.7, may be used. Alternatively, a carbon-doped silicon oxide (CDO or SiOC), having k with a value such as 2.9-3.2, may be used.

A material having k with a value such as 2.4-2.7 may also be used. Such a material may be porous, including an aerogel or a xerogel, and may require the use of a capping layer (not shown) to surround the insulator 103 so as to prevent diffusion, intermixing, or reaction with other materials. In one embodiment, the capping layer may include silicon nitride ($Si_3N_4$), or silicon oxynitride (SiON).

The insulator 103 may include a dielectric material formed in a reactor from precursors by using chemical vapor deposition (CVD), such as plasma-enhanced CVD (PECVD). Alternatively, the insulator 103 may include a spin-on dielectric (SOD) material dispensed by a track from a liquid source. In some cases, the SOD material may require the use of an adhesion layer (not shown).

Photolithography may be used to pattern an etch mask 96 in a radiation-sensitive material, such as a photoresist 101. First, the photoresist 101 is applied over the insulator 103 of the substrate 102. Next, a photomask, such as a reticle 100, is aligned to the wafer 1000 in an imaging system. The imaging system may include a contact printer, a projection aligner, a wafer stepper, or a wafer scanner. Then, the imaging system exposes the photoresist 101 to radiation 98 that is modulated by the reticle 100. Radiation 98 having the appropriate wavelength and energy may be provided by an illumination source and transmitted through a projection optics (PO) package. The illumination source may include a lamp, a laser, or an electron beam.

Exposure of the photoresist 101 to an appropriate dose of the radiation 98 will form a latent image that corresponds to the reticle 100. Development of the latent image will form the etch mask 96 having a feature 99, as shown in an embodiment of the present invention in FIG. 1A.

The feature 99 patterned in the etch mask 96 may be transferred by an etch process into an opening 105 in the underlying insulator 103. The etch process to form the opening 105 may include a plasma or reactive ion etch (RIE) process. The opening 105 uncovers a portion of the bond pad 104 of the device (not shown) in the substrate 102, as shown in an embodiment of the present invention in FIG. 1B.

The opening 105 may include various shapes, profiles, and dimensions that are derived from a design and a layout of the reticle 100. In an embodiment of the present invention, the opening 105 may include a via with an aspect ratio (depth to width) that may be selected from a range of about 3:1-10:1.

If an etch mask 96 etch selectivity (ratio of etch rate of insulator 103 to etch rate of etch mask 96) is not sufficiently large, a hard mask (not shown) having a slower etch rate than the photoresist 101 may be added between the upper surface of the insulator 103 and the lower surface of the overlying photoresist 101.

In such a case, a first etch process is used to transfer the feature 99 that is patterned in the etch mask 96 into a corresponding feature (not shown) in the underlying hard mask (not shown). Then, a second etch process transfers the corresponding feature (not shown) from the hard mask (not shown) into the underlying insulator 103 to form the opening 105. The hard mask (not shown) may include a material such as silicon nitride ($Si_3N_4$) or silicon oxynitride (SiON).

If a bond pad 104 etch selectivity (ratio of etch rate of insulator 103 to etch rate of underlying bond pad 104) is not sufficiently large, an etch stop layer (not shown) having a slower etch rate than the underlying bond pad 104 may be added between the upper surface of the bond pad 104 and the lower surface of the overlying insulator 103.

The etch stop layer (not shown) may include a material such as silicon nitride ($Si_3N_4$) or silicon carbide (SiC). If desired, an etch stop layer having a k with a lower value, such as 3.0-4.0, may be used to reduce the capacitance of the stack 106 of the electrically conducting materials and the insulator 103 in and on the wafer 1000.

Next, a barrier layer 115 may be formed over the insulator 103 as a liner to cover the sidewalls and bottom of the opening 105. The barrier layer 115 should not completely fill in the opening 105. The barrier layer 115 may have a thickness selected from a range of about 50-600 Angstroms. The barrier layer 115 should block diffusion from an overlying seed layer 120 into the underlying insulator 103 or substrate 102.

The barrier layer 115 may include electrically conducting material, such as a metal or an alloy. In an embodiment of the present invention, the barrier layer 115 may include a lower layer of tantalum nitride (TaN) to adhere to the underlying insulator 103 and an upper layer of tantalum (Ta) to adhere to an overlying seed layer 120. Such a bilayer for the barrier layer 115 may have a total thickness selected from a range of about 150-350 Angstroms.

If the aspect ratio of the opening 105 is about 5:1 or larger, coverage of the sidewalls of the opening 105 may be improved by forming the barrier layer 115 with ionized physical vapor deposition (I-PVD). Alternatively, the barrier layer 115 may be formed by using metal-organic CVD (MOCVD). When a thickness of about 100 Angstroms or less is desired, a better uniformity in thickness may be achieved by forming the barrier layer 115 with atomic-layer deposition (ALD).

Figure 1C:
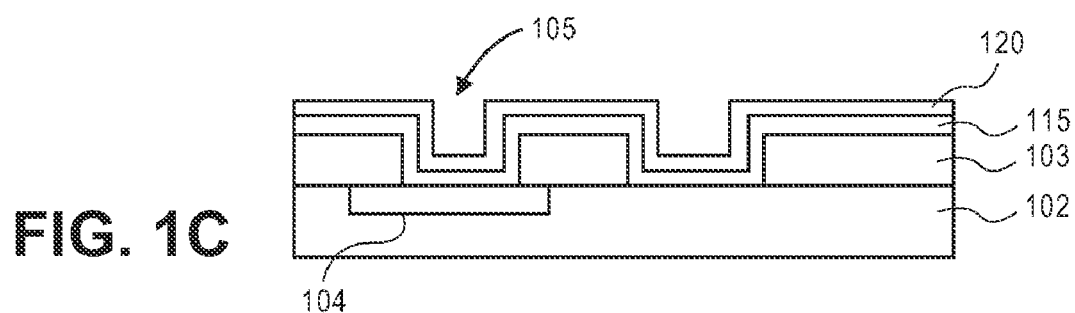

When the conductor 130 is to be subsequently formed by an electrochemical process, such as electroplating, a seed layer 120 may be initially formed over the barrier layer 115, as shown in an embodiment of the present invention in FIG. 1C.

In order to serve as a base for electroplating, the seed layer 120 should be electrically conducting with uniform coverage over the barrier layer 115. The seed layer 120 may include a metal, such as copper, or an alloy. The seed layer 120 should not completely fill in the opening 105. The seed layer 120 may have a thickness selected from a range of about 20-2,500 Angstroms. The seed layer 120 may be formed by I-PVD, CVD, ALD, or electroless plating.

Figure 1D:
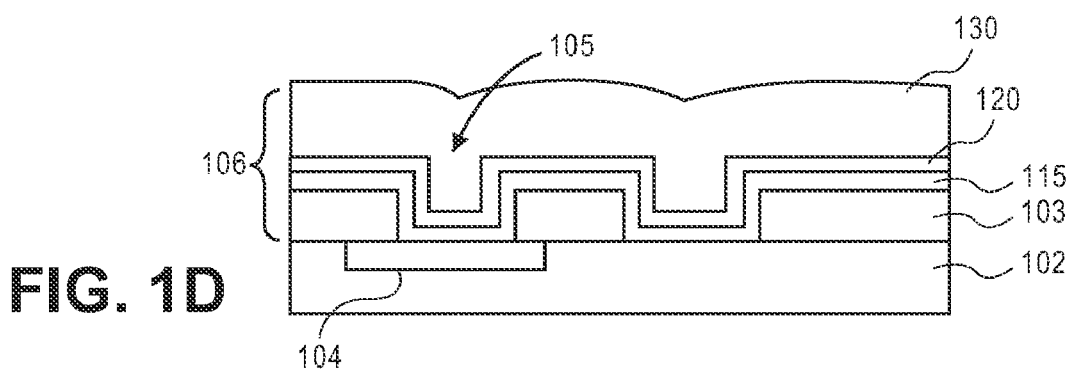

Next, a conductor 130 may be formed over the seed layer 120 to completely fill in the opening 105, as shown in an embodiment of the present invention in FIG. 1D. The conductor 130 should be electrically conducting with uniform coverage over the seed layer 120. The conductor 130 may include a metal, such as copper, or an alloy. The conductor 130 and the seed layer 120 may be formed from the same material or from different materials. The conductor 130 may have a thickness selected from a range of about 0.2-2.8 um.

When the conductor 130 is formed by an electrochemical process, a slower deposition rate may result in a smaller grain size. A smaller grain size may result in better material properties.

When the conductor 130 is to be subsequently formed by a non-electrochemical process, such as PVD or CVD, including MOCVD, the conductor 130 may be formed directly over the barrier layer 115, without first forming a seed layer 120 over the barrier layer 115.

During or after formation of the conductor 130, a treatment may be used to modify bulk properties or surface characteristics of the conductor 130. The treatment of the conductor 130 may include a rapid thermal anneal (RTA) after deposition to modify or stabilize the grain size of the conductor 130.

Depending upon various factors, such as deposition conditions, nominal thickness, and anneal conditions, copper that has been formed by electroplating may have a grain size of about 0.1-1.0 millimeter (mm). The conductor 130 may include copper having a resistivity of about 1.0-4.0 milliohm-centimeter.

Figure 1E:
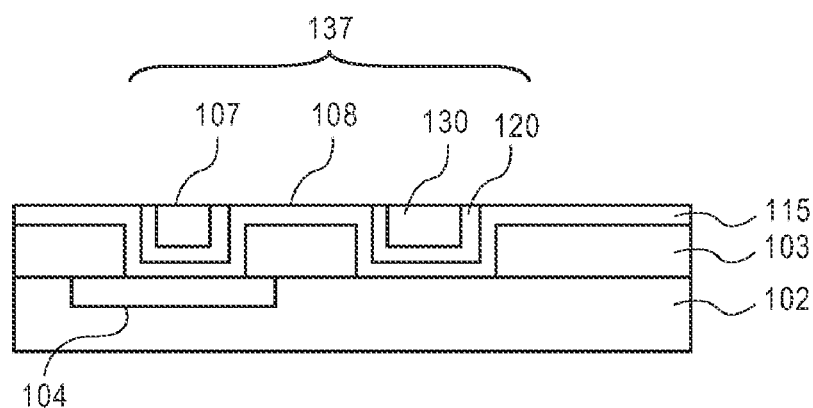

An electrical contact to the underlying bond pad 104 in the substrate 102 may be formed in the wafer 1000 by planarization of the conductor 130 (and the seed layer 120) across the wafer 1000 to uncover an upper surface 108 of the barrier layer 115, as shown in an embodiment of the present invention in FIG. 1E.

Next, a portion of the barrier layer 115 outside and away from the opening 105 may be removed to uncover an upper surface 109 of the insulator 103. A plug 135 that is inset or inlaid in the opening 105 may be formed, as shown in an embodiment of the present invention in FIG. 1F.

The plug 135 may include a portion of the conductor 130 together with adjacent and underlying portions of the seed layer 120 and the barrier layer 115. The shape and dimensions of the plug 135 may be influenced by the shape and dimensions of the opening 105. In an embodiment of the present invention, the plug 135 may be a pillar, a post, or a stud when the opening 105 is a contact hole or a via. In another embodiment of the present invention, the plug 135 may be a line or a wire when the opening 105 is a trench.

A raised contact to the underlying bond pad 104 in the substrate 102 may be formed in the wafer 1000 by partial recession of the insulator 103 surrounding the plug 135. Recessing the insulator 103 more the conductor 130 is thinned will result in a net protrusion of the plug 135 above an upper surface of the insulator 103, as shown in an embodiment of the present invention in FIG. 1G.

In an embodiment of the present invention, one or more chemical-mechanical polishing (CMP) processes may be used to planarize and recess various materials at different rates so as to achieve desired polish selectivities. CMP combines abrasion (mechanical forces) with dissolution (chemical reactions).

In another embodiment of the present invention, a plasma or RIE process may be used for planarization of the conductor 130 and partial recession of the insulator 103. The plasma or RIE process may be performed with an etch mask formed from an etch-resistant material, such as photoresist.

In an embodiment of the present invention, the plug 135 may serve as the raised contact that is electrically connected to the underlying bond pad 104. In another embodiment of the present invention, the plug 135 may serve as the raised contact that is electrically connected to two or more underlying bond pads. In still another embodiment of the present invention, the bond pad 104 may be electrically connected to two or more overlying plugs.

The partial recession of the insulator 103 surrounding the plug 135 may not be uniform, especially when comparing an interior location with an exterior location. The interior location may refer to an area within a cluster or array 137 of two or more plugs. The exterior location may refer to an area outside the cluster or array 137 of two or more plugs.

A plug relief 122 is a difference in height or protrusion of a polished upper surface 111 of the plug 135 relative to an interior upper surface 110 of the insulator 103. The nominal value of the plug relief 122 may be selected from a range of about 0.03-0.30 um.

A step height 124 is a difference in height or protrusion of the polished upper surface 111 of the plug 135 relative to an exterior upper surface 112 of the insulator 103. The nominal value of the step height 124 may be selected from a range of about 0.04-0.60 um.

In an embodiment of the present invention, the plug relief 122 may be about 0.10-0.20 um. In another embodiment of the present invention, the step height 124 may be about 0.15-0.40 um. In still another embodiment of the present invention, the plug relief 122 may be about the same as the step height 124.

The step height 124 may be about 50.0% or less of the initial thickness of the insulator 103. The plug relief 122 may be controlled more tightly than the step height 124. In one embodiment of the present invention, the plug relief 122 may have a range across the substrate 102 of about 8.0% or less while the step height 124 may have a range across the substrate 102 of about 12.0% or less.

An insulator relief 123 for the cluster or the array 137 of two or more plugs is a difference between the plug relief 122 and the step height 124. Minimizing the insulator relief 123 may permit a desired plug relief 122 to be achieved from a thinner initial thickness 126 for the insulator 103. The insulator relief 123 may be an oxide relief when the insulator 103 is formed from an oxide.

A field region refers to the exterior locations that are very far from the clusters or arrays 137 of two or more plugs. In an embodiment of the present invention, the insulator relief 123 when measured relative to the field region may be different from, and is usually larger than, the insulator relief 123 when measured relative to the exterior locations that are nearer to the cluster or array 137 of two or more plugs.

Figure 2A:
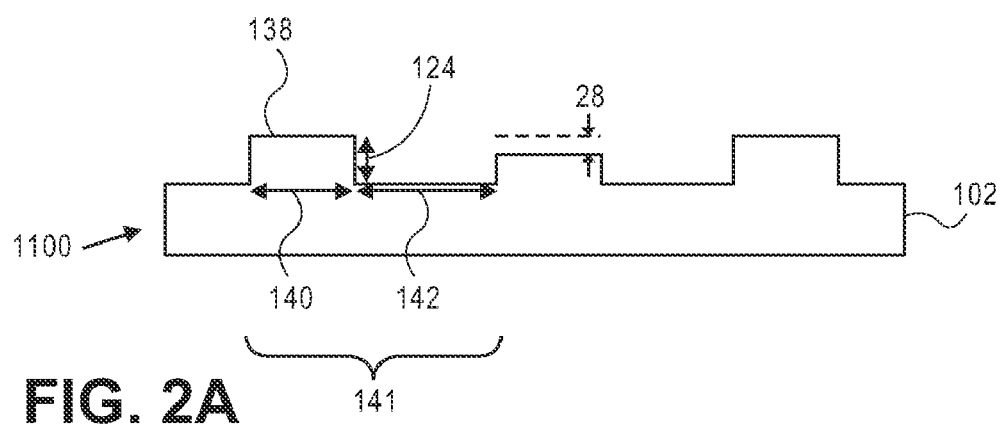
FIG. 2A is an illustration of a cross-sectional view of an embodiment of a wafer having raised contacts with variable heights to be bonded according to the present invention.

The plug 135 on the substrate 102 protrudes above a level of the insulator 103 and may serve as part of a first raised contact 138 on a first wafer 1100, as shown in an embodiment of the present invention in FIG. 2A.

Next, the first wafer 1100 may be pretreated. The materials on the first wafer 1100 may include the substrate 102, the insulator 103, and the conductor 130, as shown in an embodiment of the present invention in FIG. 1F.

Pretreatment may include one or more processes, such as wet processing, prebaking, and plasma treatment. Pretreatment may remove contamination, such as an organic residue, and etch a surface layer, such as an oxide film over the wafer 1100.

Pretreatment may clean and condition a surface of the raised contact 138 to improve bonding. Pretreatment may also modify or roughen the surface of the raised contact 138.

Figure 2B:
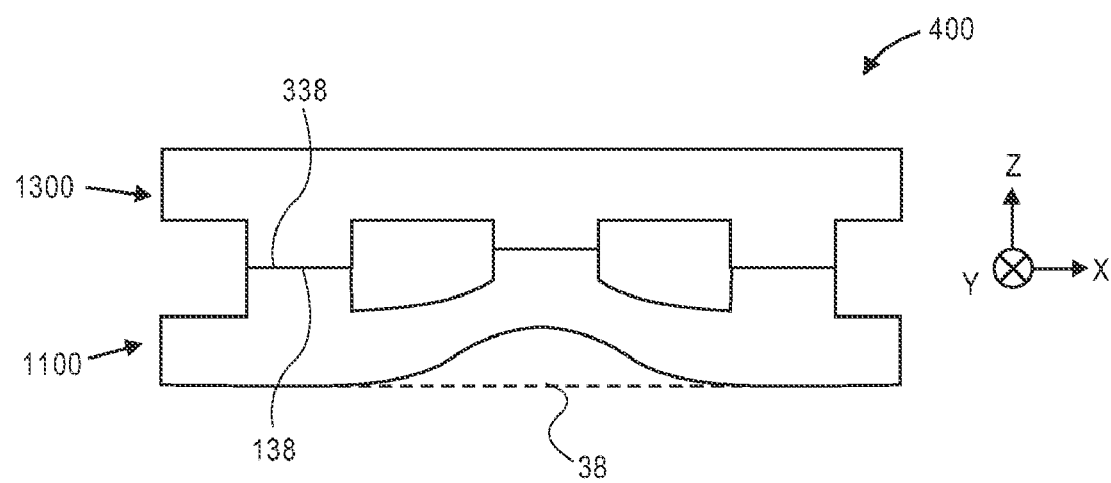
FIG. 2B is an illustration of a cross-sectional view of an embodiment of a bonded-wafer structure formed from two wafers having raised contacts with variable heights according to the present invention.
Figure 3B:
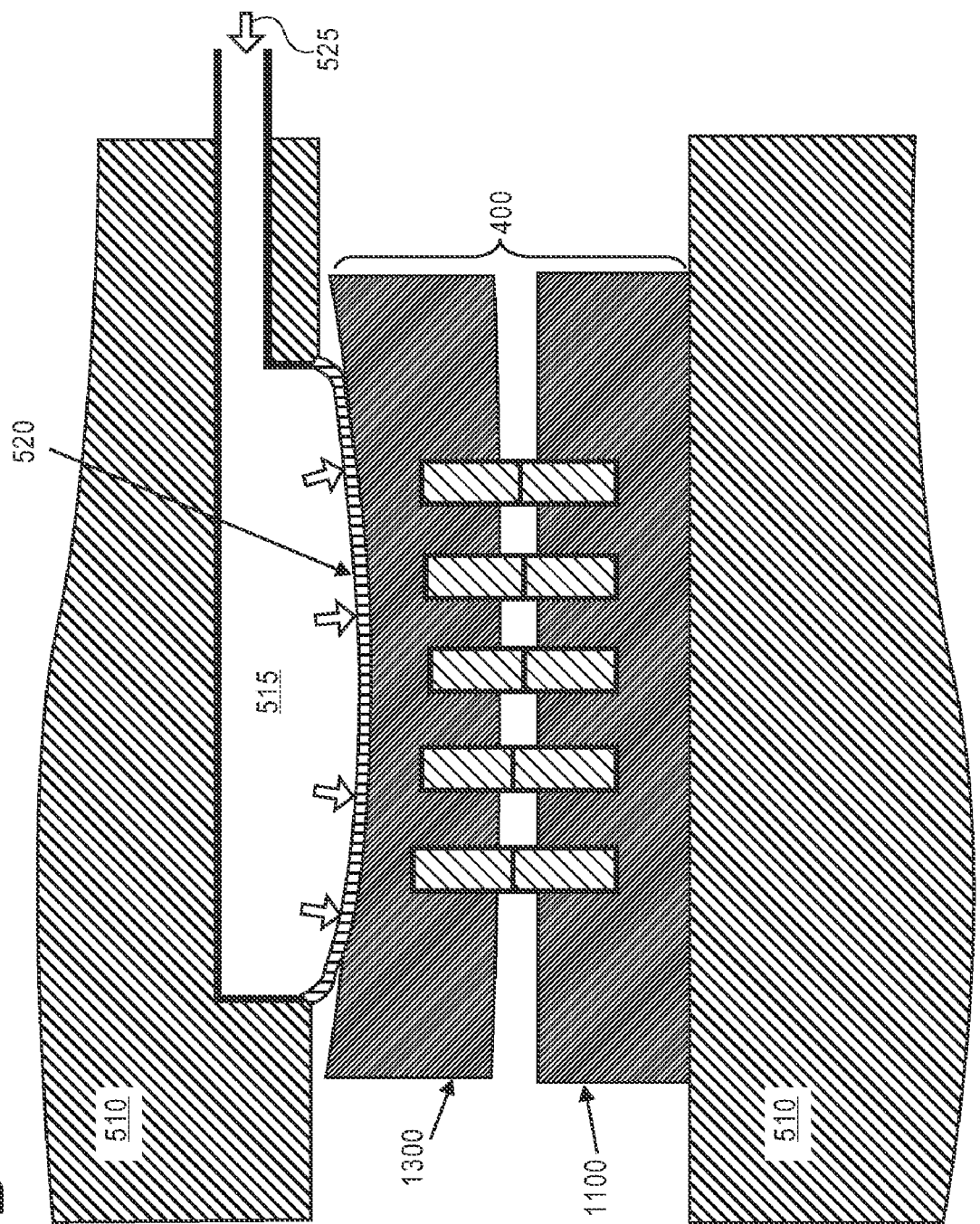
Figure 3C:
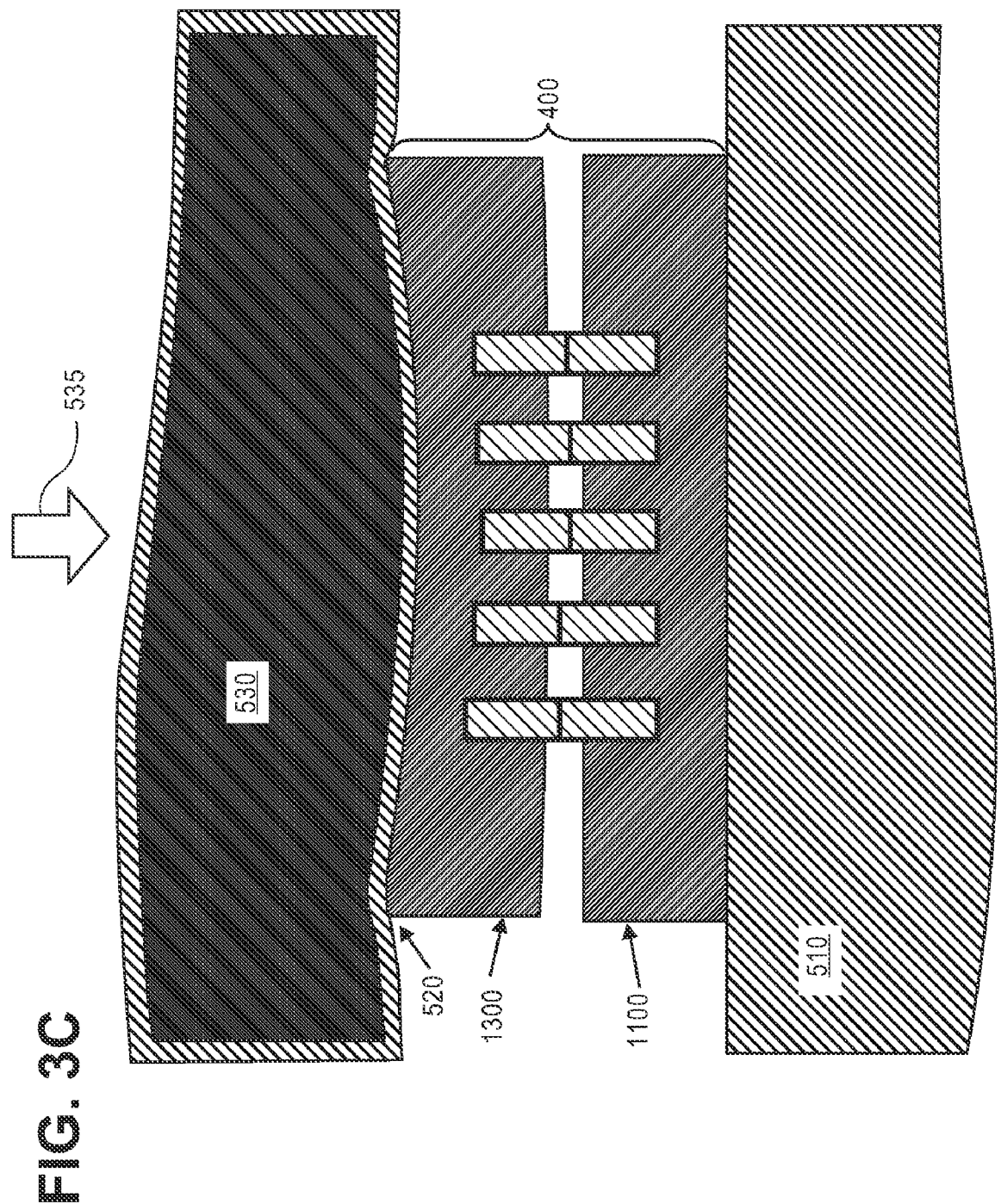

In an embodiment of the present invention, a second wafer 1300 and the first wafer 1100 may be oriented face-to-face, as shown in an embodiment of the present invention in FIG. 2B. In another embodiment of the present invention, the second wafer 1300 and the first wafer 1100 may be oriented face-to-back (not shown) or back-to-face (not shown). In still another embodiment of the present invention, the second wafer 1300 and the first wafer 1100 may be oriented back-to-back (not shown).

In an embodiment of the present invention, the second wafer 1300 may be structurally similar (with respect to materials, layers, thicknesses, dimensions, and physical interconnections) to the first wafer 1100. In another embodiment of the present invention, the second wafer 1300 may be functionally similar (with respect to underlying devices and equivalent electrical circuitry) to the first wafer 1100.

In an embodiment of the present invention, all or some of the raised contacts 338 on the second wafer 1300 may be a mirror image of the raised contacts 138 on the first wafer 1100. In yet another embodiment of the present invention, the second wafer 1300 and the first wafer 1100 may be structurally and functionally dissimilar.

Next, the second wafer 1300 and the first wafer 1100 may be aligned in both an x-direction and a y-direction. The x-direction and the y-direction form a plane that is coplanar with the wafers 1100, 1300. In an embodiment of the present invention, the second wafer 1300 may be directly aligned to the first wafer 1100. In another embodiment of the present invention, the second wafer 1300 and the first wafer 1100 may be separately aligned to a common reference target. The separate alignment may be performed sequentially or concurrently.

After alignment in the x-direction and the y-direction has been accomplished, first raised contacts 138 on the first wafer 1300 and corresponding raised contacts 338 on the second wafer 1300 may be moved towards each other in a z-direction to achieve a close proximity. The close proximity should be achieved in the lateral directions, such as in the x-direction and the y-direction, as well as in the vertical direction, such as in the z-direction. The z-direction also lies in a direction of a spacing between the first raised contact 138 on the first wafer 1100 and the second raised contact 338 on the second wafer 1300, as shown in an embodiment of the present invention in FIG. 2B.

The design and layout of the first raised contact 138 on the first wafer 1100 and the design and layout of the second raised contact 338 on the second wafer 1300 should take into account the material properties of the wafers 1100, 1300.

The design and layout of the raised contacts 138, 338 should also take into account any process tolerance that may affect the shapes or dimensions of the wafers 1100, 1300, including any expected variation in, as well as any typical change to, important parameters, such as coplanarity, flatness, parallelism, and thickness.

The design and layout of the raised contacts 138, 338 may also include certain shapes, dimensions, orientations, and redundancies, such as a cluster or array, so as to enable good alignment of the wafers 1100, 1300 despite any warpage or distortion of the wafers. The distortion may be elastic or inelastic. The distortion may be due to a stress that was caused mechanically. The distortion may be due to a stress that was induced thermally.

Thermally-induced stress may occur due to a mismatch in a coefficient of thermal expansion (CTE) of materials that meet at an interface. The substrate 102, such as silicon, may have a CTE of about 2-4 parts per million (ppm)/degree Kelvin (K). The insulator 103, such as silicon oxide, may have a CTE of about 5-12 ppm/K. The conductor 130, such as copper, may have a CTE of about 12-23 ppm/K. A solder bump (not shown), such as a lead-tin alloy, may have a CTE of about 23-29 ppm/K. A printed circuit board (not shown) may have a CTE of about 7-25 ppm/K. The printed circuit board (PCB) that has an inorganic substrate would have a CTE towards the lower end of the range while the PCB that has an organic substrate would have a CTE towards the higher end of the range.

The first raised contact 138 on the first wafer 1100 may have dimensions that include a step height (H) 124, a width (W) 140, and a gap (G) 142 from an adjacent raised contact, as shown in an embodiment of the present invention in FIG. 2A. In certain localized regions of the first wafer 1100, some of the raised contacts may be arranged in a cluster or array with a period, or pitch (P) 141, that is a sum of the width and the gap (W+G).

In an embodiment of the present invention, the dimensions for the first raised contact 138 on the first wafer 1100 may be as follows: H may have a value of about 0.25-2.50 um; W may have a value of about 45-90 um; G may have a value of about 55-110 um; and P may have a value of about 100-200 um.

In another embodiment of the present invention, the dimensions for the first raised contact 138 on the first wafer 1100 may be as follows: H may have a value of about 0.05-1.25 um; W may have a value of about 9-45 um; G may have a value of about 11-55 um; and P may have a value of about 20-100 um.

Once the second raised contact 338 on the second wafer 1300 and the corresponding first raised contact 138 on the first wafer 1100 have been aligned (such as, in the x-direction and the y-direction), the second wafer 1300 may be stacked over the first wafer 1100, with the second raised contact 338 facing the first raised contact 138. After bringing the raised contacts 138, 338 into close proximity, appropriate pressure and heat may be applied, followed by an anneal, to bond the raised contacts 138, 338 on the wafers 1100, 1300.

Voids between the raised contacts 138, 338 are not desirable. In an embodiment of the present invention, non-coplanarity of the raised contacts 138, 338 may be related to variable heights of the raised contacts 138, 338 resulting from non-uniformities in CMP. A height variation 28 in the raised contacts is shown in FIG. 2A.

In another embodiment the present invention, the non-coplanarity may be related to the shapes or dimensions of the wafers 1100, 1300, including problems with flatness, parallelism, warpage, expansion, shrinkage, or distortion. It is desirable for the upper side of each wafer to be lie in a plane (x-direction and y-direction). It is desirable for the lower side of each wafer to lie in another plane (x-direction and y-direction). It is desirable for each wafer to have the plane of its upper side be parallel with the plane of its lower side.

Consequently, an embodiment of the present invention contemplates bringing together the raised contacts 138, 338 on the wafers 1100, 1300 and deflecting the wafers 1100, 1300 locally to bond the raised contacts 138, 338. Depending on whether the raised contacts 138, 338 are located on the face or back, the wafers 1100, 1300 may be brought together face-to-face, face-to-back, back-to-face, or back-to-back. The spacing between the two wafers 1100, 1300 may vary locally as the wafers 1100, 1300 are locally deflected 38 to bond the raised contacts 138, 338, as shown in FIG. 2B.

Another embodiment of the present invention envisions using a highly-compliant plate for bonding to ensure good mechanical contact of the bonding surfaces of the raised contacts 138, 338 so that the bonding process may then produce good electrical contact between the raised contacts 138, 338.

In an embodiment of the present invention, the highly compliant plate may include compartments, channels, or passageways, through which a fluid, such as a gas or a liquid, may apply sufficient pressure to the non-bonding side of the wafer to locally deflect the wafer during bonding. The fluid may be heated. In another embodiment of the present invention, a compliant barrier, such as a flexible membrane or a thin metal foil, may separate the fluid from the non-bonding side of the wafer. In still another embodiment of the present invention, the highly compliant plate may include valves, seals, O-rings, reservoirs, and pumps. In yet another embodiment of the present invention, the highly compliant plate may include sensors, detectors, regulators, and feedback mechanisms for pressure and temperature.

In another embodiment of the present invention, the highly compliant plate may include a filler material enclosed in a hollow core and separated from the non-bonding side of the wafer by a compliant barrier. The filler material may be heated. The filler material may have a low melting point. The filler material may have properties of a liquid at the temperature that is used for bonding. The filler material may include gallium, indium, or mercury. The filler material may transmit a force through the compliant barrier to locally deflect the non-bonding side of the wafer during bonding.

In an embodiment of the present invention, a first bonding pressure may be applied in the positive z-direction to a first wafer. In another embodiment of the present invention, a second bonding pressure may be applied in the negative z-direction to the second wafer. In still another embodiment of the present invention, the same bonding pressure may be applied in the positive z-direction to the first wafer and applied in the negative z-direction to the second wafer. In yet another embodiment of the present invention, different pressures may be applied concurrently to the two wafers.

In an embodiment of the present invention, the pressure that is applied may be selected from a range of about 0.1-0.8 MegaPascals (MPa). In another embodiment of the present invention, the pressure that is applied may be selected from a range of about 0.8-1.5 MPa. In still another embodiment of the present invention, the pressure that is applied may be selected from a range of about 1.5-2.2 MPa.

In an embodiment contemplated by the present invention, the edges of two aligned and stacked wafers may be sealed, followed by bonding the raised contacts (that face each other) in a pressurized and heated chamber, such as an autoclave. Instead of using a bonding plate, a gas may be pumped into the chamber to locally deflect the non-bonding sides of the wafers. If desired, the two wafers may be partially bonded prior to sealing the edges of the wafers. In an embodiment of the present invention, the edges of the wafers may be sealed with copper sealing rings. In another embodiment of the present invention, the edges of the wafers may be sealed with an underfill.

In an embodiment of the present invention, the pressure that is used for bonding may depend on the thickness of the wafer that is being bonded. In another embodiment of the present invention, the pressure that is used for bonding may depend on the temperature that is used for bonding.

In an embodiment of the present invention, heating may enhance interdiffusion between the raised contacts. In another embodiment of the present invention, heating may enhance grain growth between the raised contacts. In still another embodiment of the present invention, heating may enhance recrystallization between the raised contacts. In yet another embodiment of the present invention, heating may form an interface between the raised contacts.

Figure 1F:
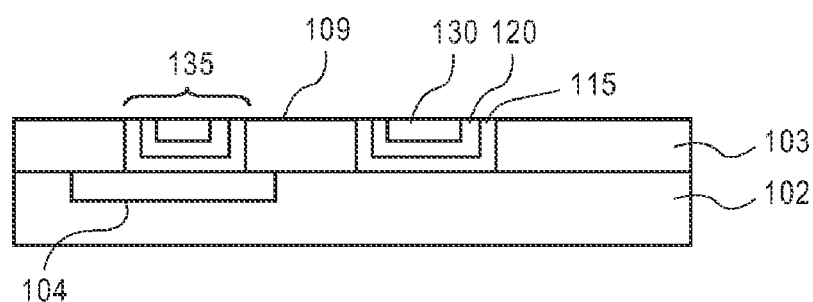
Figure 1G:
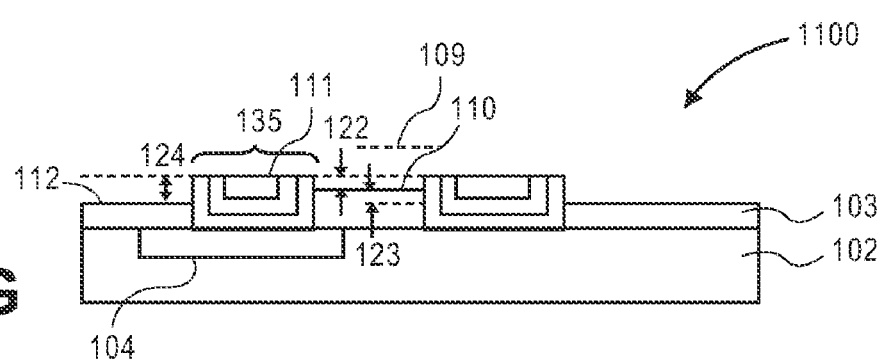

In an embodiment of the present invention, the bonding temperature may be kept below about 550 degrees Centigrade to prevent diffusion of copper through the barrier layer 115, as shown in FIG. 1F.

In an embodiment of the present invention, the heat may be used to achieve a bonding temperature selected from a range of about 250-450 degrees Centigrade. In another embodiment of the present invention, the heat may be used to achieve a bonding temperature of about 400 degrees Centigrade.

In an embodiment of the present invention, the heat may be increased or decreased during wafer bonding to dynamically achieve various bonding temperatures.

In an embodiment of the present invention, the bonding duration may be about 30 minutes. In another embodiment of the present invention, the bonding duration may be about 60 minutes.

Applying bonding pressure will force the raised contacts to touch each other. In an embodiment of the present invention, the raised contacts have similar surface roughness and the high points touch. In another embodiment of the present invention, the raised contacts have similar surface roughness and the high point touches the low point. In still another embodiment of the present invention, the raised contacts have significantly different surface roughness and touch each other in an irregular way.

In an embodiment of the present invention, the way that the raised contacts touch each other at the bonding temperature will affect interdiffusion between the raised contacts. In another embodiment of the present invention, the way that the raised contacts touch each other at the bonding temperature will affect grain growth between the raised contacts. In still another embodiment of the present invention, the way that the raised contacts touch each other at the bonding temperature will affect recrystallization between the raised contacts. In yet another embodiment of the present invention, the way that the raised contacts touch each other at the bonding temperature will affect shapes and properties of the interface that may be formed between the raised contacts.

In an embodiment of the present invention, the interface between the raised contacts may appear jagged. In another embodiment of the present invention, the interface between the raised contacts may appear smooth. In still another embodiment of the present invention, the interface between the raised contacts may be imperceptible.

In an embodiment of the present invention, most of the diffusion occurs at the grain boundary. In another embodiment of the present invention, most of the diffusion occurs at the interface between the raised contacts. In still another embodiment of the present invention, most of the diffusion occurs inside the grain. In yet another embodiment of the present invention, diffusion inside the grain (bulk diffusion) contributes the least to wafer bonding.

In an embodiment of the present invention, yield stress in the (220) orientation may be lower than yield stress in the (111) orientation. Yielding under stress will minimize surface or strain energy. In another embodiment of the present invention, grain growth in the (220) orientation during annealing may be faster than grain growth in the (111) orientation during annealing. In still another embodiment of the present invention, electromigration lifetime in the (220) orientation may be shorter than electromigration lifetime in the (111) orientation. In yet another embodiment of the present invention, (220) grains may be less desirable with respect to reliability of the bonded layer between raised contacts than (111) grains.

After the raised contacts on the two wafers have been bonded by application of bonding pressure at a bonding temperature for a bonding duration, the bonded-wafer structure may be annealed at an annealing temperature for an annealing duration in an annealing ambient atmosphere. In an embodiment of the present invention, pressure is not applied to the bonded-wafer structure during annealing.

In an embodiment of the present invention as shown in FIG. 2B, the bonded-wafer structure 400 is first cooled down (after bonding), such as to room temperature, before annealing. In another embodiment of the present invention, the temperature may be kept below 120 degrees Centigrade to avoid grain growth. In another embodiment of the present invention, the bonded-wafer structure 400 may be annealed (after bonding) without undergoing an intermediate cooling step.

In an embodiment of the present invention, annealing may be performed to resume grain growth at an interface between the raised contacts. In another embodiment of the present invention, annealing may be performed to convert the interface between the raised contacts to a bonded layer. In another embodiment of the present invention, annealing may be performed to increase bonding strength and uniformity between the raised contacts.

In an embodiment of the present invention, annealing at a higher temperature may result in a greater bonding strength and a better bonding uniformity between the raised contacts. In another embodiment of the present invention, the annealing temperature may be kept below about 550 degrees Centigrade to prevent diffusion of copper through the barrier layer 115, as shown in FIG. 1F.

In an embodiment of the present invention, the annealing temperature may be selected from a range of about 250-450 degrees Centigrade. In another embodiment of the present invention, the annealing temperature may be about 400 degrees Centigrade.

In an embodiment of the present invention, annealing for a longer duration may result in a greater bonding strength and a better bonding uniformity between the raised contacts. However, the properties of the bonded layer may saturate, or stabilize, as optimum values are approached so that further annealing may only produce small or negligible improvement.

In an embodiment of the present invention, the annealing duration may be about 30 minutes. In another embodiment of the present invention, the annealing duration may be about 60 minutes.

An equivalent bonding strength between the raised contacts may usually be achieved with either a higher temperature-shorter duration combination or a lower temperature-longer duration combination. In an embodiment of the present invention, the annealing temperature and the annealing time may be selected based on the combination that may achieve the best bonding uniformity between the raised contacts. In another embodiment of the present invention, the annealing temperature and the annealing time may be selected based on the combination that may minimize damage to devices on the chip. In still another embodiment of the present invention, the annealing temperature and the annealing time may be selected based on the combination that may minimize cost.

In an embodiment of the present invention, the annealing ambient atmosphere may include nitrogen gas. In another embodiment of the present invention, the annealing ambient atmosphere may include argon gas. In still another embodiment of the present invention, the annealing ambient atmosphere may include a vacuum. In most cases, heat transfer should be adequately fast and uniform so as to achieve and maintain the desirable temperature.

After bonding and annealing, the second raised contact 338 on the second wafer 1300 and the corresponding first raised contact 138 on the first wafer 1100 may be joined by a bonding layer. The bonding layer may have good quality, good integrity, good adhesion, and low stress.

In an embodiment of the present invention, the bonding layer may include a homogeneous layer of copper. The homogeneous layer may involve interdiffusion of copper atoms across the interface between the raised contacts. Grain growth and recrystallization may occur in forming Cu—Cu bonds.

In an embodiment of the present invention, oxide may be present in the bonding layer with a low concentration, such as 3% by weight or lower. In another embodiment of the present invention, oxide that may be present in the bonding layer should be uniformly distributed.

In an embodiment of the present invention, defects may be present in the bonding layer with a low concentration. In another embodiment of the present invention, defects may be present in the bonding layer with a random distribution. Defects may include stacking faults, twins, and dislocations. Voids and vacancies are not desirable in the bonding layer.

In an embodiment of the present invention, the resistance of the bonding layer after annealing may be about 1 milliohm or lower.

An embodiment of a bonded-wafer structure 400 that has been locally deflected 38, according to the present invention, is shown in FIG. 2B. The local deflection 38 of FIG. 2B compensates for the height variation 28 of FIG. 2A to prevent formation of a void between the raised contacts.

In an embodiment of the present invention, the bonded-wafer structure may include more than two wafers. In another embodiment of the present invention, a third wafer may be bonded to the first wafer or the second wafer.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of bonding wafers using highly compliant plates, as well as, a bonded-wafer structure having copper contacts with variable heights.

We claim:

1. A method comprising:

providing a first wafer, said first wafer having a first raised contact;

stacking a second wafer over said first wafer, said second wafer and said first wafer being structurally and functionally dissimilar, said second wafer having a second raised contact, said second raised contact facing said first raised contact;

applying different pressure to said first wafer and said second wafer to locally deflect said first wafer and said second wafer wherein said applying pressure is accomplished with a filler material enclosed in a hollow core of a highly compliant plate, said filler material comprising gallium; and heating said first wafer and said second wafer to bond said first raised contact and said second raised contact.

2. A method comprising:

providing a first wafer, said first wafer having a first raised contact;

stacking a second wafer over said first wafer, said second wafer and said first wafer being structurally and functionally dissimilar, said second wafer having a second raised contact, said second raised contact facing said first raised contact;

applying different pressure to said first wafer and said second wafer to locally deflect said first wafer and said second wafer; and heating said first wafer and said second wafer to bond said first raised contact and said second raised contact wherein said heating is accomplished with a filler material enclosed in a hollow core of a highly compliant plate, said filler material comprising indium.

3. A method comprising:

providing a first wafer, said first wafer having a first raised contact;

stacking a second wafer over said first wafer, said second wafer and said first wafer being structurally and functionally dissimilar, said second wafer having a second raised contact, said second raised contact facing said first raised contact;

applying different pressure to said first wafer and said second wafer to locally deflect said first wafer and said second wafer wherein said applying pressure is accomplished with a filler material enclosed in a hollow core of a highly compliant plate, said filler material having a low melting point, said filler material comprising gallium; and heating said first wafer and said second wafer to bond said first raised contact and said second raised contact.

4. A method comprising:

providing a first wafer, said first wafer having a first raised contact;

stacking a second wafer over said first wafer, said second wafer and said first wafer being structurally and functionally dissimilar, said second wafer having a second raised contact, said second raised contact facing said first raised contact;

applying different pressure to said first wafer and said second wafer to locally deflect said first wafer and said second wafer, wherein said applying pressure is accomplished with a filler material enclosed in a hollow core of a highly compliant plate, said filler material comprising gallium; and heating said first wafer and said second wafer to bond said first raised contact and said second raised contact.

5. A method comprising:

providing a first wafer, said first wafer having a first raised contact;

stacking a second wafer over said first wafer, said second wafer and said first wafer being structurally and functionally dissimilar, said second wafer having a second raised contact, said second raised contact facing said first raised contact;

applying different pressure to said first wafer and said second wafer to locally deflect said first wafer and said second wafer; and heating said first wafer and said second wafer to bond said first raised contact and said second raised contact, wherein said heating is accomplished with a filler material enclosed in a hollow core of a highly compliant plate, said filler material comprising indium.

6. A method comprising:

providing a first wafer, said first wafer having a first raised contact;

stacking a second wafer over said first wafer, said second wafer and said first wafer being structurally and functionally dissimilar, said second wafer having a second raised contact, said second raised contact facing said first raised contact;

applying different pressure to said first wafer and said second wafer to locally deflect said first wafer and said second wafer, wherein said applying pressure is accomplished with a filler material enclosed in a hollow core of a highly compliant plate, said filler material having a low melting point, said filler material comprising gallium; and heating said first wafer and said second wafer to bond said first raised contact and said second raised contact.

* * * * *